(12) United States Patent
Ni et al.

(10) Patent No.: US 6,548,348 B1
(45) Date of Patent: Apr. 15, 2003

(54) METHOD OF FORMING A STORAGE NODE CONTACT HOLE IN A POROUS INSULATOR LAYER

(75) Inventors: Chyi-Tsong Ni, Hsin-Chu (TW); Eric Su, Kaohsiung (TW); Kevin Tsai, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 10 days.

(21) Appl. No.: 09/883,164

(22) Filed: Jun. 18, 2001

(51) Int. Cl.[7] ........................................ H01L 21/8242
(52) U.S. Cl. ........................ 438/253; 257/309
(58) Field of Search ............................. 257/3; 438/253

(56) References Cited

U.S. PATENT DOCUMENTS

| | | | |
|---|---|---|---|
| 5,208,479 A | | 5/1993 | Mathews et al. ............ 257/534 |
| 5,318,920 A | | 6/1994 | Hayashide .................... 437/47 |
| 6,008,540 A | * | 12/1999 | Lu et al. ......................... 257/3 |
| 6,100,137 A | * | 8/2000 | Chen et al. ................. 438/253 |
| 6,140,178 A | | 10/2000 | Tseng .......................... 438/253 |
| 6,351,370 B1 | * | 2/2002 | Konuma et al. ............ 252/500 |

* cited by examiner

*Primary Examiner*—William David Coleman
(74) *Attorney, Agent, or Firm*—George O. Saile; Stephen B. Ackerman

(57) ABSTRACT

A process for increasing the surface area of a DRAM capacitor structure via definition of a capacitor in a porous insulator layer, wherein the porous insulator layer is comprised with voids, has been developed. The process features the use of an anisotropic dry etch procedure to form a capacitor opening in a porous insulator layer, exposing a portion of the voids located on the sides of the capacitor opening extending into the porous insulator layer. An isotropic wet etch is then used to enlarge the surface area of the exposed voids, allowing the surface area for a subsequently formed, overlying storage node structure, to be increased.

10 Claims, 4 Drawing Sheets

METHOD OF FORMING A STORAGE NODE CONTACT HOLE IN A POROUS INSULATOR LAYER

BACKGROUND OF THE INVENTION (1) Field of the Invention

The present invention relates to methods used to fabricate semiconductor devices, and more specifically to a method used to increase the surface area of a capacitor structure.

(2) Description of Prior Art

The advent of micro-miniaturization, or the ability to fabricate semiconductor devices using sub-micron features, has allowed the performance of these devices to be increased while the cost of manufacturing these same devices has decreased. Smaller semiconductor chips, still offering device densities equal to, or greater than, device densities achieved with larger size semiconductor chips, have allowed the fabrication cost of a specific chip to be reduced. However the smaller semiconductor chips, such a dynamic random access memory (DRAM) chips, are now comprised with smaller individual transfer gate transistors, which in turn commit less horizontal space for the DRAM stacked capacitor structures. Therefore to satisfy capacitance requirements novel designs for DRAM capacitor structures, featuring increased vertical features needed to compensate for the decreased horizontal features now necessitated with sub-micron DRAM devices, have been employed. Storage node components, of DRAM capacitor structures, have been fabricated with fin type features, crown shaped features, and cylindrical shaped features, in an attempt to increase the surface area of a DRAM capacitor structure which now directly overlays a horizontally shrinking, underlying DRAM transfer gate transistor component.

The processes needed to fabricate DRAM capacitor structures, comprised with fin type, crown shaped, or cylindrical type features, although resulting in the desired increase in capacitor surface are, however do increase process complexity and cost. The present invention will describe a novel process for increasing capacitor surface area, without the complex and costly processes needed for the DRAM capacitor structures comprised with fin, crown and cylindrical shapes. This invention will describe a process in which the desired, increased capacitor surface area is obtained via conventional formation of a storage node structure, in a storage node contact hole opening, however with the storage node opening formed in a specific type insulator layer, and subjected to specific process steps prior to accommodation of the storage node structure. Prior art such as Hayashide et al, in U.S. Pat. No. 5,318,920, as well as Tseng, in U.S. Pat. No. 6,140,178, describe methods of increasing the surface area of DRAM capacitor structures, however these prior arts do not use the novel approach described in this invention entailing the formation of a storage node opening formed in a porous insulator layer.

SUMMARY OF THE INVENTION

It is an object of this invention to fabricate a capacitor structure for a DRAM device.

It is another object of this invention to increase the surface area of DRAM storage node structure by forming this structure in a storage node opening comprised with sidewall crevices and grooves.

It is still another object of this to form the crevices and grooves in the sidewall of the storage node opening via formation of the storage node opening in a porous insulator layer, followed by wet etch procedures used to enlarge the crevices and grooves.

In accordance with the present invention a method of forming a storage node structure for a DRAM capacitor structure, in a storage node opening which has been defined in a porous insulator layer, featuring grooves and crevices located in the sides of the storage node opening, enabling increases in storage node surface area to be achieved, is described. After formation of conductive plug structures in openings in an insulator layer, contacting underlying conductive regions of a DRAM transfer gate transistor, a porous insulator layer is deposited. Storage node openings are next defined in the porous insulator layer exposing the top surface of the underlying conductive plug structures, and exposing small grooves, or crevices, located in the sides of the storage node openings, extending into the porous insulator layer, with the small grooves formed from exposure of voids in the porous insulator layer, during the dry etching, storage node opening procedure. A subsequent wet etch procedure is then used to enlarge the small grooves and crevices, resulting in a storage node opening featuring large grooves and crevices extending into the porous insulator layer. Deposition of a polysilicon layer results in a storage node structure contacting the underlying storage node plug structure, as well as located on the sides of, including in the large crevices and grooves of, the storage node opening. Formation of a capacitor dielectric layer, on the storage node structure, and of an upper electrode structure, results in a DRAM capacitor structure with increased capacitor surface area as a result of the grooves and crevices formed in the sides of a storage node opening, which in turn was formed in a porous insulator layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
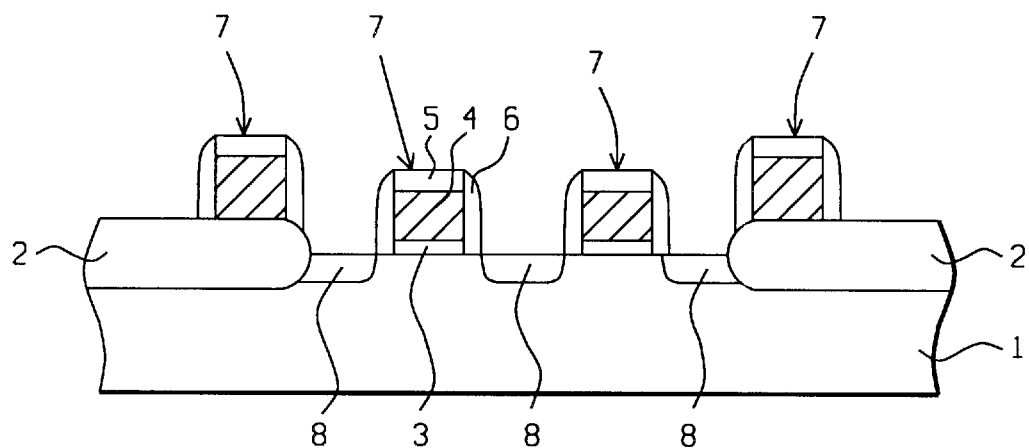
FIGS. 1–7, which schematically, in cross-sectional style, describe key stages of fabrication used to obtain a DRAM capacitor structure, with increased capacitor surface area as a result of grooves and crevices formed in the sides of a storage node opening, which in turn were formed in a porous insulator layer.

The process of fabricating a DRAM capacitor structure with increased capacitor surface area resulting from the formation of a storage node structure, located in a storage node opening defined in a porous insulator layer, and featuring grooves and crevices in the sides of the storage node opening extending into the porous insulator layer, will now be described in detail. A P type, semiconductor substrate 1, comprised of single crystalline silicon, with a <100> crystallographic orientation, is used and schematically shown in FIG. 1. Isolation regions 2, such as field oxide (FOX), regions, at a thickness between about 2000 to 5000 Angstroms, are formed in portions of semiconductor substrate 1, via thermal oxidation procedures, using a patterned silicon nitride layer (not shown in the drawings), as an oxidation mask preventing subsequent device regions from the thermal oxidation procedure. After removal of the silicon nitride, oxidation retarding layer, via use of a hot phosphoric acid solution, gate insulator layer 3 comprised of silicon dioxide, is thermally grown to a thickness between about 50 to 200 Angstroms, on regions of semiconductor substrate 1, not occupied by isolation regions 2. Polysilicon layer 4, is then deposited via low pressure chemical vapour deposition (LPCVD), procedures, at a thickness between about 600 to 1500 Angstroms. Polysilicon layer 4, is either doped in situ via the addition of arsine, or phosphine to a silane ambient, or polysilicon layer 4, is deposited intrinsically then doped via implantation of arsenic or phosphorous ions. If desired a polycide layer, comprised of an overlying tungsten silicide layer, and an underlying doped polysilicon layer, can be used in place of polysilicon to lower the resistance of a subsequent word line. Silicon nitride layer 5, is next deposited, via LPCVD or via plasma enhanced chemical vapour deposition (PECVD), procedures, at a thickness between about 500 to 1200 Angstroms. Conventional photolithographic and anisotropic reactive ion etching (RIE), procedure, are used to define silicon nitride capped, gate structures 7, shown schematically in FIG. 1. After removal of the photoresist shape used for definition of silicon nitride capped, gate structures 7, insulator spacers 6, are formed on the sides of silicon nitride capped gate structure 7, via the deposition of an insulator layer such as silicon oxide or silicon nitride, using LPCVD or PECVD procedures, at a thickness between about 400 to 800 Angstroms, followed by a blanket, anisotropic RIE procedure, using $CF_4$ as an etchant. Source/drain regions 8, are then formed in regions of semiconductor substrate 1, not covered by the silicon capped, gate structures 7, or by insulator spacers 6, via implantation of arsenic or phosphorous ions, at an energy between about 30 to 70 KeV, and at a dose between about 1E14 to 1E16 atoms/cm$^2$. The result of these procedures is schematically shown in FIG. 1.

Figure 2:
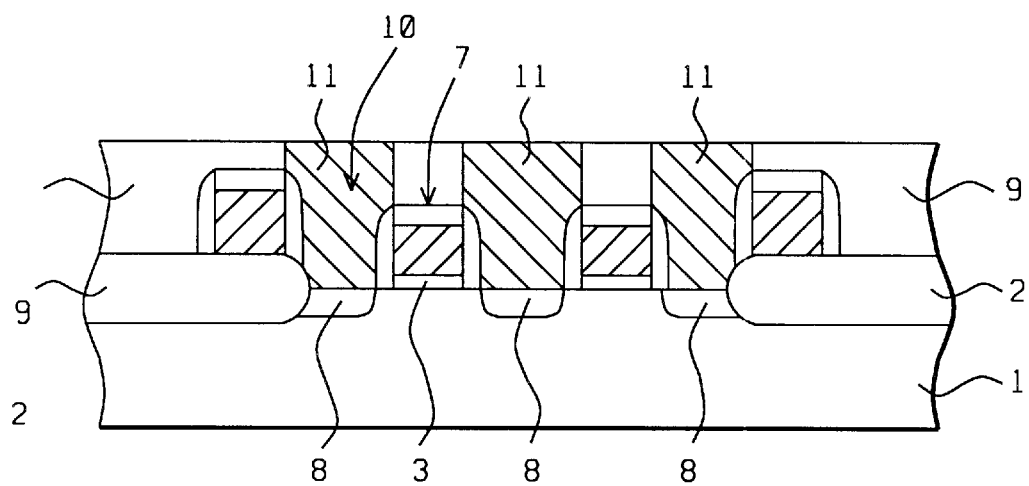

Insulator layer 9, comprised of silicon oxide, or of borophosphosilicate glass (BPSG), is next deposited at a thickness between about 8000 to 10000 Angstroms, via LPCVD or PEC VD procedures. To obtain a smooth top surface topography, a chemical mechanical polishing (CMP), procedure is employed for planarization. Photolithographic and anisotropic RIE procedures, are next employed to define openings 10, in insulator layer 9, using $CHF_3$ as an etchant. After removal of the photoresist shape, used to define openings 10, storage node plug structures 11, are formed in openings 10. This is accomplished via deposition of a conductive layer, such as an arsenic or phosphorous, in situ doped polysilicon layer, using LPCVD procedures at a thickness between about 1000 to 3000 Angstroms, completely filling openings 10. Removal of in situ doped polysilicon layer from the top surface of insulator layer 9, is accomplished via a CMP procedure, or via a selective RIE procedure, using $Cl_2$ as an etchant for polysilicon, resulting in storage node structures 11, in openings 10. This is schematically shown in FIG. 2. If desired storage node plug structures can be comprised of tungsten, or tungsten silicide.

Figure 3:
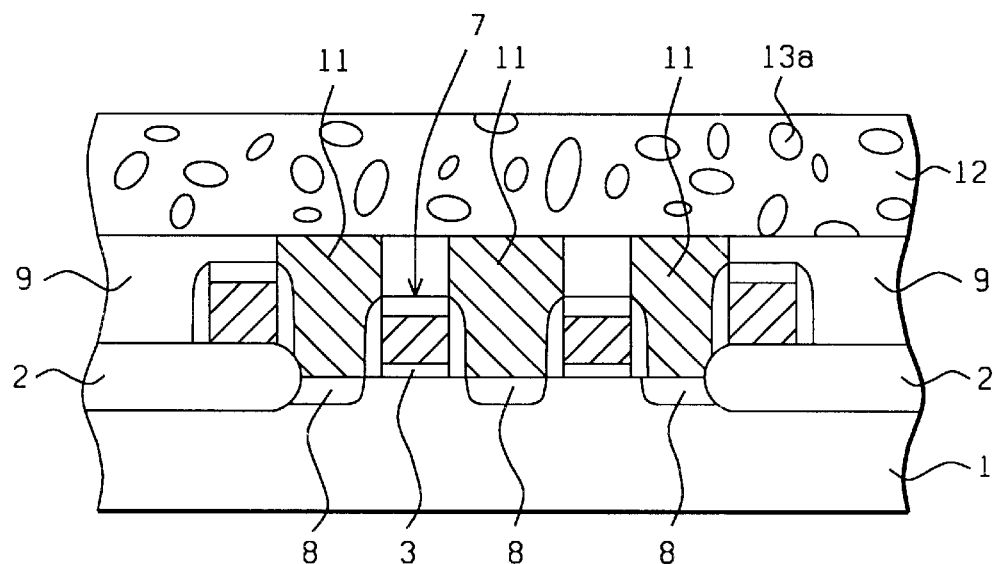

Porous insulator layer 12, critical to this invention, is next formed. Porous insulator layer 12, is comprised of silicon oxide, obtained via thermal chemical vapor deposition procedures, at a temperature between about 250 to 500° C., to a thickness between about 4000 to 20000 Angstroms. The mode of deposition, as well as the temperature of deposition, result in the intentional attainment of voids 13a, in the insulator layer, resulting in desired porous insulator layer 12, shown schematically in FIG. 3. The diameter of voids 13a, is between about 200 to 1200 Angstroms. If desired a polymer layer can be used for porous insulator layer 12.

Figure 4:
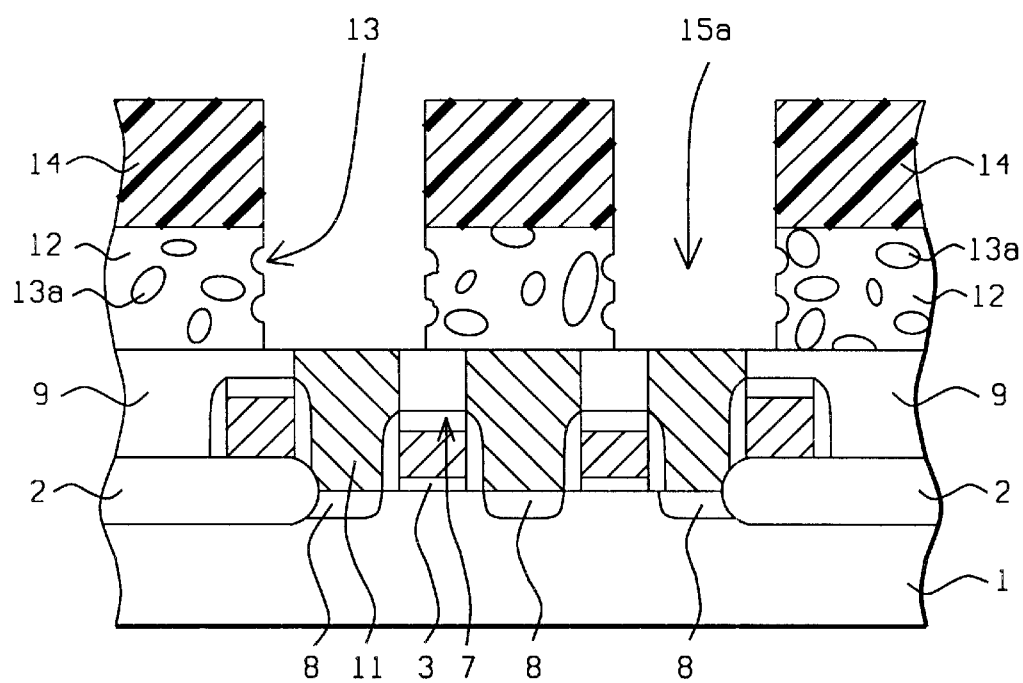
Figure 5:
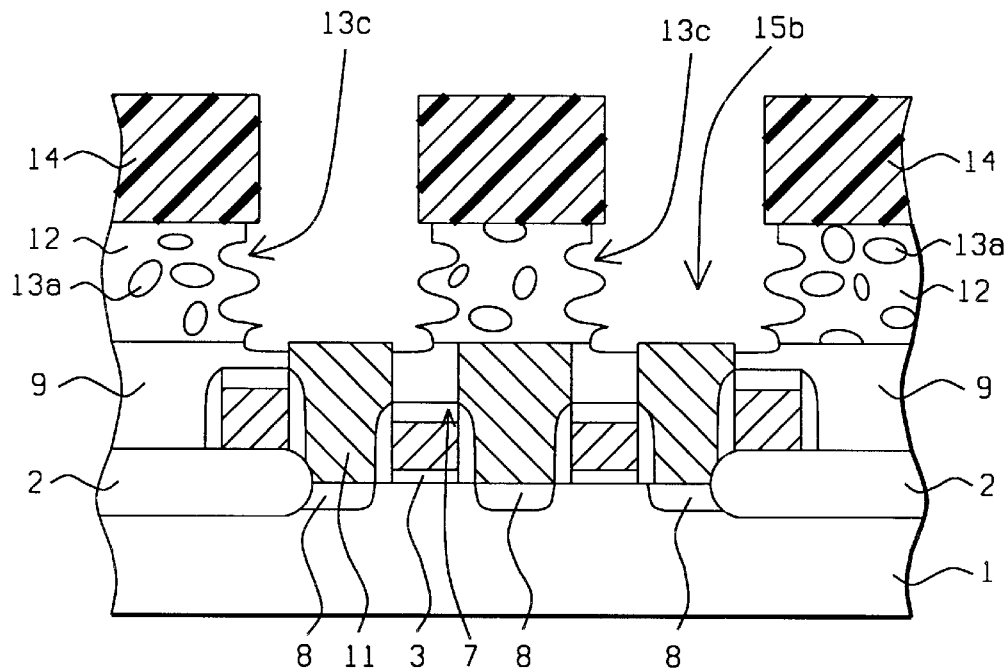

Photoresist shape 14, is next formed and used as an etch mask to define capacitor openings 15a, in porous insulator layer 12. This is accomplished via an anisotropic, reactive ion etching (RIE), procedure, using $CHF_3$ as an etchant for porous insulator layer 12. The selective, anisotropic RIE procedure results in the exposure of the top surface of storage plug structures 11, in addition to uncovering voids 13a, exposed in the sidewall of capacitor opening 15a. The portion of voids 13a, now exposed in capacitor opening 15a, are addressed as uncovered void, or small grooves 13b, extending between about 200 to 1000 Angstroms into porous insulator layer 12. This is shown schematically in FIG. 4. With photoresist shape 14, still in place, a buffered hydrofluoric (BHF), or a dilute hydrofluoric (DHF), acid solution is used to isotropically, or laterally etch the exposed surfaces of uncovered voids 13b, resulting in large grooves or crevices 13c, now further extending between about 400 to 1600 Angstroms laterally into porous insulator layer 12. The result of this isotropic wet etch procedure is the evolution of capacitor openings 15b, now slightly undercutting photoresist shape 14, however now comprised with the desired larger grooves 13c, which increase the exposed surface area of capacitor opening 15b, when compared to capacitor opening 15a. This is schematically shown in FIG. 5. Grooves 13c, extend laterally into the sides of porous insulator layer 12, in capacitor openings 15b, between about 400 to 1600 Angstroms. Photoresist shape 14, can now removed via plasma oxygen ashing and careful wet cleans.

Figure 6:
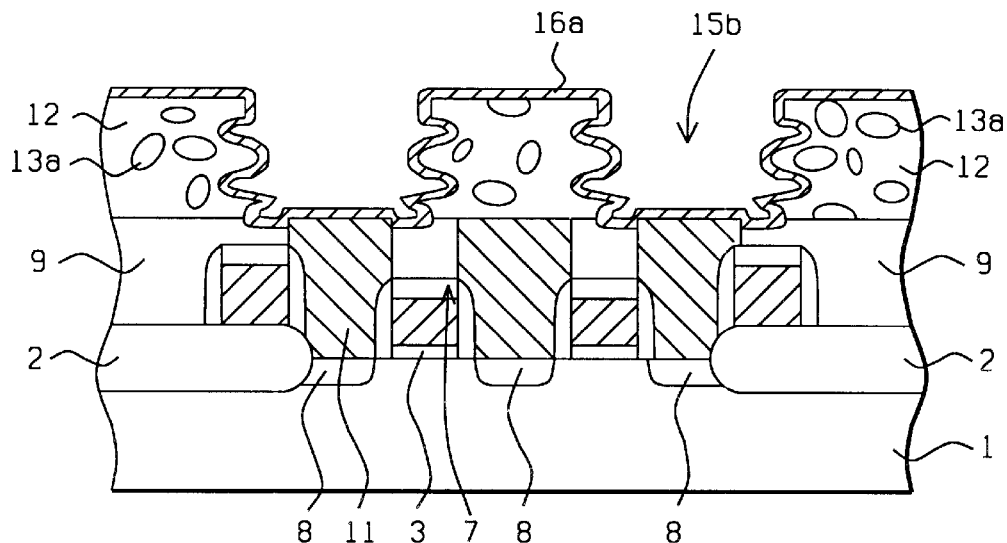
Figure 7:
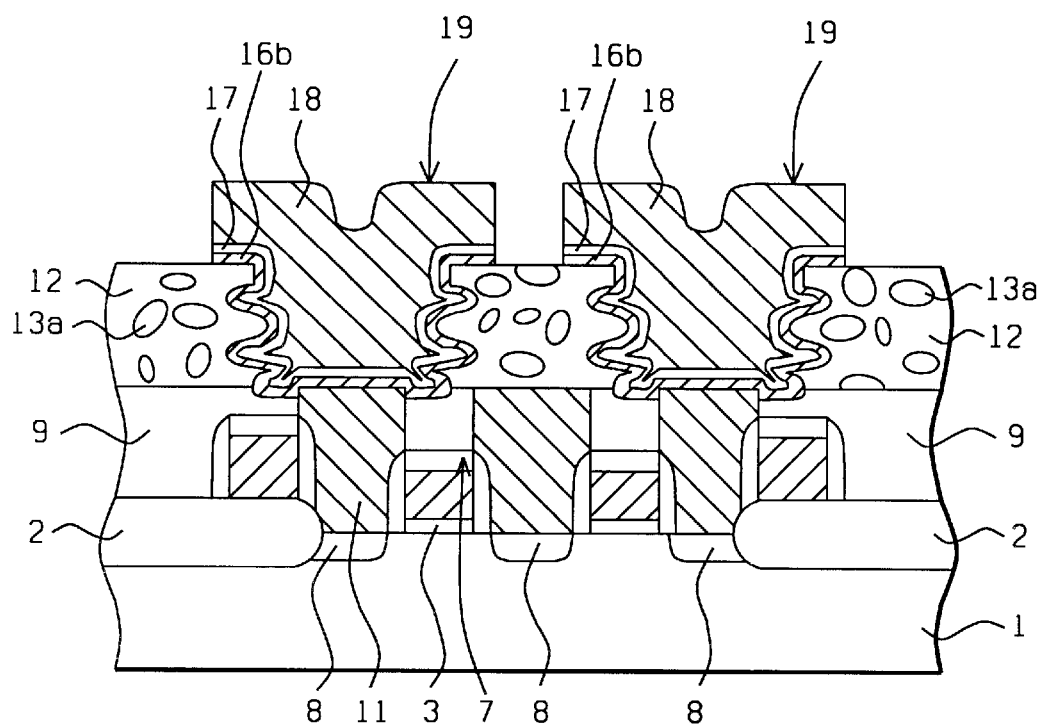

Polysilicon layer 16a, is next deposited via LPCVD procedures at a thickness between about 250 to 500 Angstroms. Polysilicon layer 16a, is in situ doped during deposition via the addition of arsine, or phosphine, to a silane ambient. The excellent conformality characteristics of LPCVD procedures allow continuity of polysilicon layer 16a, resulting in complete coverage of all surfaces of grooves 13c, in capacitor openings 15b. This is schematically shown in FIG. 6. Capacitor dielectric layer 17, comprised of a high dielectric constant material such as tantalum oxide ($Ta_2O_5$), oxidized silicon nitride (ON), or oxidized silicon nitride on oxide (ONO), is next formed on polysilicon layer 16a, at a thickness between about 50 to 300 Angstroms. This is followed by the deposition of polysilicon layer 18, via LPCVD procedures, at a thickness between about 400 to 800 Angstroms. Polysilicon layer 18, is doped in situ, during deposition, via the addition of arsine, or phosphine, to a silane ambient. A photoresist shape, not shown in the drawings, is next employed as an etch mask allowing an anisotropic RIE procedure to define capacitor structure 19, shown schematically in FIG. 7, comprised of polysilicon upper electrode structure 18, capacitor dielectric layer 17, and storage node structure 16b, formed from polysilicon layer 16a. The anisotropic RIE procedure is performed using $Cl_2$ or $SF_6$ as an etchant for the polysilicon layers, while $CHF_3$ or $CF_4$ was employed as an etchant for capacitor dielectric layer 17. The photoresist shape used for definition of capacitor structure 19, is removed again using plasma oxygen ashing and careful wet clean procedures. The surface area, thus capacitance of capacitor structure 19, was increased as a result of formation of lateral grooves 13c, in capacitor opening 15b, which in turn was achieved via an isotropic wet etch procedure performed to exposed surfaces of the porous insulator layer in which the capacitor opening was defined in. These procedures result in capacitances between abut 50 to 75% greater than capacitances achieved for counterpart structures fabricated without wet etch, sidewall groove formation in a porous insulator layer.

While this invention has been particularly shown and described with reference to, the preferred embodiments thereof, it will be understood by those skilled in the art that various changes in form and details may be made without departing from the spirit and scope of this invention.

What is claimed is:

1. A method of forming a capacitor structure for a DRAM device featuring a capacitor opening defined in a porous insulator layer, then subjected to a wet etch procedure to form grooves in the sides of said capacitor opening, to increase the surface area for a subsequently formed capacitor structure, comprising the steps of:

providing transfer gate transistor structures, comprised of word line structures, with source/drain regions located in a region of said semiconductor substrate not covered by said word line structures, and providing storage node plugs, overlying and contacting said source/drain regions;

depositing said porous insulator layer, with said porous insulator layer comprised containing voids;

performing a first anisotropic dry etch procedure to define a first capacitor opening in said porous insulator layer, exposing top surface of a storage node plug structure, and with said first capacitor opening exposing a portion of said voids in said porous insulator layer, located on the sides of said first capacitor opening;

performing said wet etch procedure resulting in formation of a second capacitor opening, featuring grooves in sides of said second capacitor opening, with said grooves formed from said portion of voids, and with said grooves extending from sides of said second capacitor layer into said porous insulator layer;

depositing a first polysilicon layer, coating all exposed surfaces of said second capacitor opening;

forming a capacitor dielectric layer on said first polysilicon layer;

depositing a second polysilicon layer; and performing a second anisotropic dry etch procedure to form said capacitor structure, incorporating definition of a capacitor top plate structure from said second polysilicon layer, definition of a capacitor dielectric component, and definition of a storage node structure from said first polysilicon layer, with said storage node structure located in said second capacitor opening, wherein said second capacitor opening is comprised with said grooves extending from sides of said second capacitor opening into said porous insulator layer.

2. The method of claim 1, wherein said porous insulator layer is a silicon oxide layer, obtained at a thickness between about 4000 to 20000 Angstroms, via thermal chemical vapor deposition procedures, at a temperature between about 250 to 500° C.

3. The method of claim 1, wherein the diameter of said voids, in said porous insulator layer, is between about 200 to 1200 Angstroms.

4. The method of claim 1, wherein said first anisotropic dry etching procedure, used to define said first capacitor opening in said porous insulator layer, is an anisotropic RIE procedure, using $CHF_3$ as an etchant for said porous insulator layer.

5. The method of claim 1, wherein said wet etch procedure, used to form said second capacitor opening, is an isotropic wet etch procedure, performed using either a buffered hydrofluoric (BHF), or a dilute hydrofluoric (DHF), acid solution.

6. The method of claim 1, wherein said grooves on sides of said second capacitor opening, extend between about 400 to 1600 Angstroms into said porous insulator layer.

7. The method of claim 1, wherein said first polysilicon layer is obtained via LPCVD procedures, at a thickness between about 250 to 500 Angstroms, and in situ doped during deposition via the addition of arsine or phosphine to a silane ambient.

8. The method of claim 1, wherein said capacitor dielectric layer, at a thickness between about 50 to 300 Angstroms, is chosen from a group that contains oxidized silicon nitride (NO), oxidized silicon nitride on oxide (ONO), or tantalum oxide.

9. The method of claim 1, wherein said second polysilicon layer is obtained via LPCVD procedures, at a thickness between about 400 to 800 Angstroms, and in situ doped during deposition via the addition of arsine or phosphine to a silane ambient.

10. The method of claim 1, wherein said second anisotropic dry etch procedure, used to define said capacitor structure in said second polysilicon layer, in said capacitor dielectric layer, and in said first polysilicon layer, is an anisotropic RIE procedure, using $Cl_2$ or $SF_6$ as an etchant for polysilicon, while using $CHF_3$ or $CF_4$ as an etchant for said capacitor dielectric layer.

* * * * *